July 15, 1958 A. A. VARELA 2,843,809

TRANSISTORS

Filed May 11, 1954

INVENTOR

ARTHUR A. VARELA

BY Hyman Hurwitz

ATTORNEY

United States Patent Office 2,843,809
Patented July 15, 1958

2,843,809

TRANSISTORS

Arthur A. Varela, Alexandria, Va., assignor to Corvey Engineering Company, Washington, D. C., a corporation of Delaware Application May 11, 1954, Serial No. 428,892

12 Claims. (Cl. 317—235)

The present invention relates to semiconductor translating and transducing devices, and in particular to improved methods of fabricating transistors with small dimensional tolerances, such as the so-called "surface-barrier" transistor. Within the contemplation of the present invention is the provision of a new type of surface-barrier transistor and a simplified method of fabricating such transistors.

The recently announced surface-barrier transistor includes a crystal-base electrode opposed active surfaces which are intimately contacted by metallic emitter and collector electrodes respectively. This transistor is markedly different from the alloy-junction or point-contact transistor and derives its nomenclature in that the interfaces which perform the emission and collection functions are located at the surfaces of the uniform crystal-base which are contacted by the metallic electrodes. Briefly, processing of such surface-barrier transistors involves electrochemical treatment of a single crystal, usually of N-type germanium of appropriate resistivity and adequately high minority-carrier lifetime, to obtain an active region of reduced thickness. In forming the active region to dimensions of the order of a few microns, electrolytic techniques are used to preclude disturbing the active crystal surfaces.

The emitter and collector electrodes are formed on the active face region, preferably by electroplating immediately following the electrolytic etching. For this purpose, the electrolytic etchant is a metallic salt of the metal for the electrodes, such that the electroplating of the metal ions may be accomplished instantaneously and in the same treatment apparatus. Details of such processing may be found in an article appearing in the Proceedings of the Institute of Radio Engineers, December 1953, pages 1706 to 1708. The aforesaid surface-barrier transistors reportedly combine low-voltage, low-power-consumption, low-noise-figure operation at frequencies higher than attainable with available alloy-junction transistors.

Broadly, it is an object of the present invention to provide improved transistors in which the emission and collection functions of the usable current are performed at interfaces located at the surface of a uniform crystal-base electrode. It is within the contemplation of the invention to provide an improved method of fabricating such transistors having advantageous electrical properties, notably higher cut-off frequency, high gain with low operating potentials, and low noise factor.

It is a further object of the present invention to provide an improved small-dimensional transistor facilitating manufacture by somewhat simplified processing techniques.

Although the process described in the aforesaid article represents an achievement in fabricating surface-barrier transistors wherein the semiconductor is not mechanically stressed or contaminated at its surfaces, the described procedure is exacting. The reported process involves supporting a mechanically lapped and chemically etched wafter of semiconductor material in the midplane between opposed nozzles each having a circular section. The nozzles are arranged to deliver jets of an etching solution along a common axis toward opposite surfaces of the blank. The semiconductor blank or wafer, usually of germanium, is connected as the anode in the electrolytic treatment, with electrodes in the nozzle or jet-forming elements serving as cathodes. The etching action is principally confined to the region immediately coextensive with the jet cross section, since the electroylte spreads out in a thin high-resistivity film on the surface of the wafer. As the excavations produced by the two circular jets approach each other, the electrolytic current density is reduced to a low value through control of the ambient light level. As the etching action slows down, a flat bottom tends to form at each excavation with a relatively thin base separation. The excavations produced are characteristically biconcave in form and the base thickness increases at locations radially of the center of the excavation. After the desired thickness is obtained, the polarity of the etching potential is reversed, such that the etching process is converted directly into an electroplating process. Thus, the metal ions of the electrolyte are deposited in the form of electrode dots in the bottoms of the excavations.

With the barrier spacings of the order of .0002 inch, it will be appreciated that the etching times are exceptionally critical and must be determined with great accuracy. For this purpose, a pilot hole is etched through the specimen to determine the required time for break-through. With this break-through time, it is possible to accurately ascertain the required etching time to obtain excavations to a desired depth. In ascertaining the break-through time, careful timing is required with the specimen observed under a microscope.

The present invention is concerned with a less exacting method of fabricating surface-barrier transistors.

The present invention is concerned with a less exact-

Advantageously, simplified processing techniques can be used to produce a transistor having generally improved electrical properties, prominently higher cut-off frequency and high power capacity.

In accordance with an illustrative embodiment demonstrating certain aspects of the present invention, a surface-barrier transistor is provided including an electrochemically treated semiconductor body having surface barriers extending from a reference edge, the surface barriers being symmetrically disposed in relation to a plane extending medially of the semiconductor body and through the reference edge. The opposed surface barriers are generally rectangular and are somewhat concave in relation to the reference edge. In the latter respect, the semiconductor body may be considered as "hollow ground." The electrochemically-treated semiconductor body is formed with metallic terminals in contact with the respective surface barriers at regions extending outwardly from the reference edge. The crystal-base electrode will have a uniform section linearly coextensive with the reference edge, with minute increases in the thickness at locations progressively removed from the reference edge. High base thickness uniformity exhibits the important advantage of better high frequency performance than can be anticipated with a circular type of surface barrier.

In accordance with the processing aspects of the present invention, a semiconductor wafer having a reference edge, is mechanically reduced to a relatively small thickness, and treated to remove disturbed surface layers, by a controlled electrochemical etching. The reference edge of the semiconductor wafer provides a guide for opposed ribbons or streams directed at opposite surfaces of the wafer. The width of the electrolyte stream is made slightly in excess of the width of the wafer measured along the reference or control edge, such that etching is uniform along the control edge. Since the control edge may be readily observed during processing, required dimensional reductions to the order of microns may be realized with less difficulty and care.

As a feature of the invention, the semiconductor base electrode may be used to monitor the timing of the etching interval. The etching process may be continued until complete penetration of the semiconductor occurs along an etched-through line coextensively with and inwardly of the reference edge. Upon etch-through, a reasonably clean linear fracture occurs and etching may be interrupted. Upon reversal of the polarity of the operating potential plating of the emitter and collector electrodes is brought about in the interval immediately following the etching interval.

The above brief description, as well as further objects, features and advantages of the present invention will be best appreciated by reference to the following detailed description of a presently preferred illustrative embodiment and process, when taken in conjunction with the accompanying drawing, on a greatly enlarged scale, wherein:

Fig. 1 is a diagrammatic showing of a semiconductor specimen undergoing electrolytic etching in accordance with aspects of the present invention;

Fig. 2A is a perspective view of a semiconductive specimen early in a processing cycle in accordance with the invention;

Fig. 2B is a perspective view of the specimen at a time later in the processing cycle, and illustrating reduction in thickness with etching;

Fig. 2C is a perspective view of the specimen after linear break-through;

Figure 5:
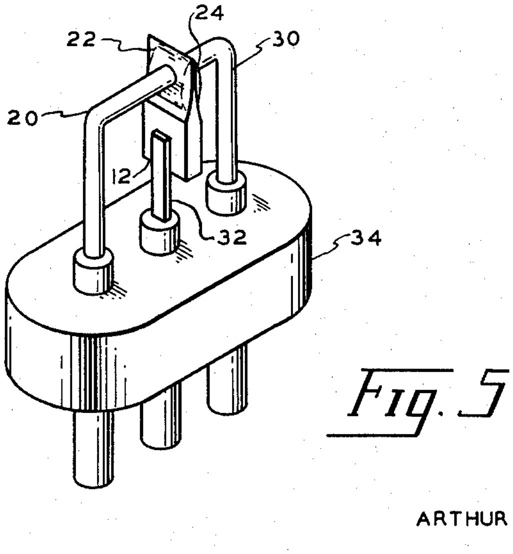
Fig. 5 is a perspective view of an improved surface-barrier transistor embodying features of the present invention.

Referring now specifically to Figs. 1 to 4 inclusive, there is shown progressively various treatment stages in forming a surface-barrier semiconductor body for incorporation in a surface-barrier transistor, as illustrated in Fig. 5. Although the process will be described with a single crystal of N-type germanium as the preferred semiconductor starting material, it will be appreciated that the process finds application to semiconductors of P-type conductivity, as well as to devices employing silicon as the semiconductor starting material. A wafer 10 of N-type germanium of appropriate resistivity and adequate high minority carrier lifetime, is cut from a thin slice of a larger crystal, as is well understood. The blank 10 is then mechanically reduced in thickness, as by lapping with an abrasive wheel or the like to the order of five to ten thousandths of an inch. Thereupon, the grinding flaws and crystal disorder on the surface are removed by controlled chemical etching, thus reducing the thickness of the lapped and etched blank 10 to the order of several thousandths of an inch. The mechanically and chemically treated blank 10 is then formed with a base electrode terminal 12, as by soldering thereto a nickel contact.

Figures 1, 2A, 2B, 2C:
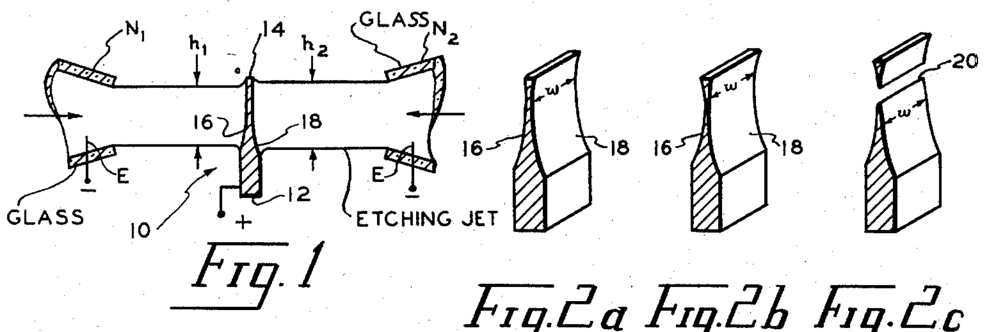

With an appropriate jig or fixture, as diagrammatically illustrated in Fig. 1, the blank is supported in the midplane between opposed jet-directing nozzles $N_1$, $N_2$ which are arranged to deliver opposed streams or jets of an electrolyte in end to end alignment to opposite surfaces 16, 18 of the blank 10. The cross-section of the nozzles $N_1$, $N_2$ are of progressively smaller rectangular sections and the jets are directed at a straight edge 14 of the blank 10 serving as a reference. The width of the rectangular nozzle cross-section is selected such that the width of the electrolyte stream is slightly greater than the width W of the germanium wafer, as seen in Figs. 2A to 2C inclusive, such that the wafer may be uniformly etched throughout its width. The overall height of one of the jets, such as $h_2$ is selected somewhat larger than the overall height of the other of the jets $h_1$, such that the final rectangular area of the surface barrier for the collector is somewhat larger than the rectangular area of the emitter. Making the input or emitter electrode smaller in area than the output or collector electrode reduces leakage currents and increases efficiency, as is well understood.

A metallic salt solution appropriate to the material and conductivity type of the specimen is used as the flowing electrolyte which is delivered to the opposite surfaces 16, 18 of the wafer 10, the cooling action of the flowing electrolyte permitting relatively high etching currents. For fabricating a surface-barrier transistor having indium emitter and collector electrodes respectively, the sulphate or chloride metal salt of relatively low pH has been found to be suitable as the electrolyte. Pressures of the order of fifteen pounds per square inch produced the required high-velocity jets along the monitoring or reference edge 14, and at locations extending inwardly therefrom in accordance with the heights $h_1$, $h_2$ of the respective jets.

Operating potentials are applied, by making the germanium specimen anode and by electrodes (not shown) in the nozzles $N_1$, $N_2$ serving as cathodes. Relatively high operating voltages, of the order of two hundred to three hundred volts are required due to the high resistivity of the jets, with current density approaching twenty amperes per square inch.

As pointed out in the literature, the crystal surface and a layer beneath the surface of a crystal to a depth of approximately one ten thousandths of an inch, contain almost no free charge carriers, either electrons or holes. The surface layer properties display exceptionally high resistivity, as contrasted to the lower resistivity interior and causes the etching rate to diminish appreciably as the surface barriers approach each other. Hence, as base thicknesses of the order of two to three microns are approached, the resistivity of the specimen becomes significant and the etching rate decreases, producing a "hollow-ground" effect as seen by progressively viewing Figs. 2A to 2C. By proper location of the jet sections in relation to the reference edge 14, etch-through at a location a short distance in from and parallel to the reference edge 14 occurs along a parting line 20. Due to the negative taper or divergence of the surfaces in the region between the parting or etched-through line 20 and the reference edge 14, the thicker edge portion drops off as illustrated in Fig. 2C. A reasonably clean fracture or etched line 20 occurs due to the self-regulating characteristics of the electrolytic processing, and of the crystalline structure of the germanium starting material.

Figures 3, 4A, 4B:
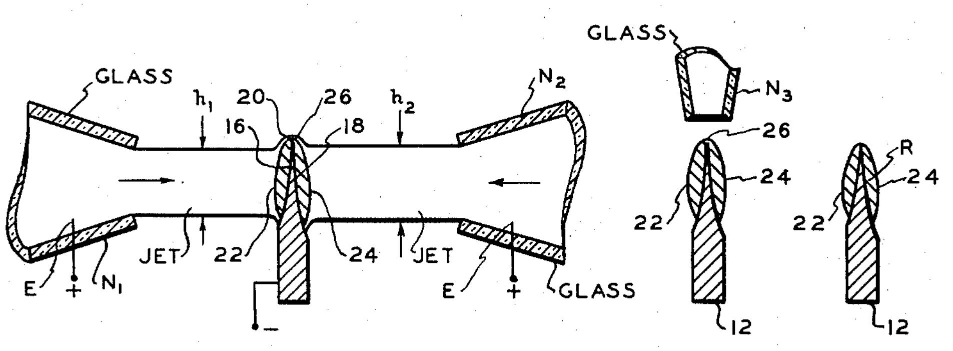
Fig. 3 is a diagrammatic showing similar to Fig. 1 but during the plating cycle of a process in accordance with the present invention.
Fig. 4A is a diagrammatic showing of a specimen after plating, and during further etching in accordance with the present invention.
Fig. 4B is a diagrammatic showing of the specimen after being processed by the apparatus shown in Fig. 4A.

Effectively, the time of etch-through along the parting line 20 may be observed through a miscrope directed at the specimen during the electrolytic processing. Upon etch-through, the polarity of the operating potential is reversed to start the plating of the emitter and collector electrodes on the electrolytically-formed surfaces 16, 18 as seen in Fig. 3. Upon changeover from electrolytic etching to electroplating, the electrolytic solution is no longer biased in the back direction with respect to the specimen. The continuous directing of the jets at the opposite surfaces 16, 18 causes the electrochemical deposition of the metal ions of the salt solution on the surfaces substantially coextensive with the jet sections $h_1$, $h_2$. Plating for a predetermined interval will deposit metal in intimate contact with the clean and undisturbed surfaces 16, 18 of the germanium wafer 10. Due to the reversal of the bias, the plating phase of the operation is not as critical as the electrolytic etching in that ambient light levels have little effect.

During the plating operation, the metallic deposits 22, 24 are bluilt up on the opposite surfaces 16, 18 at locations extending inwardly from the common etched edge 20 for distances determined by the effective jet heights $h_1$, $h_2$. As previously pointed out, jet height $h_2$ may be somewhat higher than jet height $h_1$, as of the order of .004 to .003 inch such that the larger area metallic deposit 24 may serve as the collector electrode, and the smaller area metallic deposit 22 may serve as the emitter electrode. Incident to the deposit of the electrode material, the rate of plating will decrease toward the reference edge 20. This is due to the higher resistivity of the thinner base of germanium adjacent to the reference edge 20. This thickness variation is to advantage, for reasons well understood per se.

Further, as the electroforming of the electrodes 22, 24 progresses, it is not infrequent that a layover of plating material is produced at the reference edge 20, as indicated at 26. This lapover forms an external short circuit between the emitter and collector electrodes, and may be removed as shown in Fig. 4A by directing a further jet $N_3$ of an appropriate etchant toward the lapover. The jet $N_3$ is normal to the jets $N_1$, $N_2$ and removes the lapover plating 26, such that the final configuration is as illustrated in Fig. 4B. During removal of the lapover plating 26, it is not necessary to mask adjacent portions of the emitter and collector electrodes since the etching solution may be selected as of the same order of resistivity as the germanium. Accordingly, current density falls off rapidly at locations displaced from the portions of the plating directly facing the jet, and as such the final etching procedure will be accurately defined and self limiting.

Following this final etching process, the subassembly illustrated in 4B is obtained which includes the crystal-base electrode 10 with metallic terminal 12, and active semiconductive layer R having a relatively uniform thickness throughout the extent of its rectangular area, the active layer having surface-barrier interfaces in intimate contact with metallic emitter and collector electrodes 22, 24 respectively.

Preliminary to incorporation in a final transistor package, a surface cleanup etch may be employed to remove contaminants which might provide low impedance and feed back paths at the exposed periphery of the electrodes 22, 24. Further precautionary steps may be taken, and finally the subassembly of Fig. 4B is incorporated in a transistor assembly as illustrated in Fig. 5. Emitter and collector electrode leads 28, 30 are connected respectively to the emitter and collector electrodes 22, 24 and a base supporting tab 32 is connected to the base contact 12. Thereupon, the assembly is mounted on a header or base 34 and enclosed, preferably in an air-tight casing or envelope, removed for the sake of clarity.

From the processing technique described, it is seen that the present surface-barrier transistor is characterized in that its rectangular surface-barriers extend from a common edge or reference. The semiconductor is a linear development of the cross-section illustarted in Fig. 1 and has a somewhat smaller average thickness over its active region, as compared to a comparable circular-type active region. As the average base width or thickness is diminished, the present linear-type, surface-barrier transistor will have a higher cutoff frequency then its circular-type counterpart.

Further, the practical limitations on active region size are much lower with the linear type surface-barrier transistor, and accordingly, a much higher power capacity may be anticipated by extending the linear development of the semiconductor body.

The facility of manufacture by simplified techniques should be apparent from the foregoing description. Multiple-unit processing may be accomplished by starting with a rectangular strip of semiconductive material having a long reference edge. A limited region of the opposed surfaces of the specimen along the long reference edge is etched and plated, and thereupon the processed strip is cut into smaller wafers for the individual transistors by etch-through at selected locations along and transverse of the reference edge. Such final cutting may be accomplished, for example, by a multiple-aperture nozzle capable of delivering spaced and parallel jets at selected locations of the strip, each of which extends normal to the reference edge.

From the foregoing disclosure of an illustrative embodiment and process of the invention, it will be appreciated that those skilled in the art will readily find varied application of the invention and various further modifications thereof will be readily apparent. Accordingly, the appended claims should be interpreted broadly, consistent with the spirit and scope of the invention.

What I claim is:

1. A transistor comprising a semiconductor body having surface barriers extending from a common etched edge, and emitter and collector electrodes in intimate contact with said surface barriers.

2. A transistor comprising an electrochemically fabricated semiconductor body having electrolytically etched surface barriers extending from an etch-fractured edge, and an electroplated electrode in intimate contact with each of said surface barriers.

3. In a semi conductor device, a semiconductor body having a linear edge and electrolytically formed surface barriers extending from said linear edge, said semiconductor body having a uniform development along said linear edge, an emitter electrode bonded to one of said surface barriers, and a collector electrode bonded to the other of said surface barriers.

4. A transistor comprising a germanium wafer having surface barriers extending from a common electrolytically formed edge, and metallic emitter and collector electrodes in intimate contact with said surface barriers.

5. A transistor comprising a semiconductor body having concave surface barriers diverging gradually outwardly from a common etched edge, and emitter and collector electrodes respectively in intimate contact with said concave surface barriers.

6. The method of producing a surface-barrier transistor including the steps of preparing a thin semiconductor wafer having opposed surfaces and a reference edge, electrolytically etching and forming said opposed surfaces at locations extending inwardly from said reference edge and along the entire edge length, and forming metallic electrodes in intimate contact with the etched and formed surfaces.

7. The method of producing a surface-barrier transistor including the steps of preparing a thin semiconductor wafer having opposed surfaces and an edge, electrolytically etching and forming said opposed surfaces in rectangular areas extending inwardly from said edge and along the entire edge length, and electroplating metallic electrodes in intimate contact with the etched and formed surfaces.

8. The method of producing a surface-barrier transistor including the steps of preparing a thin germanium wafer having opposed surfaces and a linear edge, electrolytically etching and forming said opposed surfaces with surface barriers at locations extending inwardly from said linear edge and along the entire edge length, and forming indium electrodes in intimate contact with the etched and formed surfaces.

9. The method of producing a surface-barrier transistor including the steps of preparing a thin semiconductor wafer having opposed surfaces and a linear reference edge, electrolytically etching and forming said opposed surfaces at locations extending inwardly from said edge and along the entire edge length for an etching interval selected to cause break-through along a linear parting line spaced inwardly of and substantially parallel to said reference edge, and forming metallic electrodes in intimate contact with the etched and formed surfaces.

10. In the manufacture of a surface-barrier transistor, the steps including cutting a substantially rectangular germanium base having a straight edge from a single crystal of N-type germanium, electrolytically excavating opposed surfaces of said base which extend inwardly from said straight edge with a metallic salt as the electrolyte for a predetermined etching interval to form an active semiconductive region having substantially uniformly-spaced surface barriers, and electroplating said surface barriers with the metal ions from said metallic salt for a predetermined plating interval immediately following said etching interval.

11. In the manufacture of a surface-barrier transistor, the steps including cutting a substantially rectangular semiconductive base having a straight edge from a single semiconductive crystal, exposing opposed surfaces of said base extending inwardly from said straight edge to a metallic salt electrolyte, electrolytically etching said opposed surfaces for an etching interval selected to form an active semiconductive region of reduced thickness having substantially uniformly spaced surface barriers, and electroplating said surface barriers.

12. In the manufacture of a surface-barrier transistor, the steps including exposing a substantially rectangular semiconductive base having a straight edge to a metallic salt electrolyte in rectangular regions extending inwardly from said straight edge, electrolytically etching for an etching interval selected to cause break-through along a line coextensive with said straight edge and forming an active semiconductive region of reduced thickness having substantially uniformly spaced surface barriers, and electroplating said surface barriers.

References Cited in the file of this patent

UNITED STATES PATENTS

| | | |
|---|---|---|
| 2,560,579 | Kock et al. | July 17, 1951 |
| 2,640,901 | Kinman | June 2, 1953 |
| 2,666,814 | Shockley | Jan. 19, 1954 |

FOREIGN PATENTS

| | | |
|---|---|---|
| 335,003 | Great Britain | Sept. 18, 1930 |

OTHER REFERENCES

Tiley et al.: "Proceedings of the I. R. E.," vol. 41, December 1953, pages 1706–1708.